United States Patent [19]
Hellinga et al.

[11] Patent Number: 5,640,304
[45] Date of Patent: Jun. 17, 1997

[54] POWER ELECTRONIC DEVICE MOUNTING APPARATUS

[75] Inventors: Richard J. Hellinga, Kitchener; Russell MacArthur Ballantyne, Baden, both of Canada

[73] Assignee: Agile Systems Inc., Waterloo, Canada

[21] Appl. No.: 499,450

[22] Filed: Jul. 7, 1995

[51] Int. Cl.⁶ .................................................. H05K 7/20
[52] U.S. Cl. ............................................ 361/707; 257/727
[58] Field of Search .................... 165/80.2, 80.3, 165/185; 174/16.3; 257/707, 713, 718–719, 726–727; 361/688, 704, 707–722

[56] References Cited

U.S. PATENT DOCUMENTS 5,077,638  12/1991  Anderson et al. ................... 361/710
5,283,467   2/1994  Goeschel et al. ................... 174/16.3

*Primary Examiner*—Gregory D. Thompson
*Attorney, Agent, or Firm*—R. Craig Armstrong

[57] ABSTRACT

A plastically deformable lever is used to compress a flat spring against the upper surface of a power electronic device in mounting the device on a bus bar or heat sink. The lever preferably is integral with the bus bar or heat sink. The heat sink or bus bar has at least one mounting area onto which at least one power electronic device may be mounted. At least one spring is positionable against an upper surface of each power electronic device to be mounted on the heat sink or bus bar, and at least one plastically deformable element is positioned such that deformation bends a spring so as to cause the spring to exert pressure against the upper surface of at least one of the power electronic devices to bias same against the heat sink or bus bar.

5 Claims, 4 Drawing Sheets

POWER ELECTRONIC DEVICE MOUNTING APPARATUS

BACKGROUND OF THE INVENTION

The present invention relates to the mechanical mounting of power electronic devices used in electronic systems.

The power handling capability of electronic components used in power electronic systems is limited by the maximum operating temperature of the device. To make cost effective use of the power devices in a system, an efficient system to remove the heat generated by these components must be used. This usually involves mounting the power devices to a heat sink which removes the heat from the device. In high power electronic systems, there may be many power devices.

During the last decade, the requirement for efficient device cooling has become even more important. It has become feasible to produce reliable, inexpensive devices capable of controlling larger currents. Semiconductor wafer processing improvements have allowed power devices of increasingly large die area to be produced with high yields and hence low cost. Packaging these larger die in inexpensive, industry standard discrete packages such as the TO-220 and the TO-247 (FIG. 2) has contributed to the low cost and popularity of these devices. TO-220 or similar class devices usually have 2 to 5 leads (most commonly 3) for connection on the printed wiring board. The most common versions have exposed metal on the surface to be mounted against the heat sink for good thermal conduction. This exposed metal surface also provides a low resistance and low inductance path to the internal semiconductor die or dice.

Even with the importance of device cooling, it is difficult to obtain low cost, reliable methods of mounting power electronic devices so that they have both an electrical connection to a printed circuit board and a mechanical, thermal and possibly electrical connection to a heat sink.

One attempt to address this need in high power systems has been to increase the integration of the power electronic devices into packages which are more reliably mounted. This approach to the mounting problem has been simply to reduce the number of components to be mounted. However, these higher integration devices are typically 2 to 10 times more expensive than the TO-220 and TO-247 class components on a volt-amp basis. These higher integrations devices are application specific and hence will never have the volume production, and hence lower cost, of the discrete power devices. Furthermore, these higher integration packages are not amenable to automated assembly.

The heat sink is a significant portion of the size, cost and weight of a power electronic system. Designers often use this heat sink as the outer packaging of the system or a power conductor (in which case it is referred to as a bus bar). Therefore, there may be system requirements to have the heat sink electrically isolated from the power devices or the devices may be required to have good electrical conduction to a bus bar.

There are four elements to reducing power device cost in a power electronic system:

a. Use the most inexpensive devices on a volt-amp basis.

b. Use the device at its rated current capacity by ensuring efficient and reliable thermal contact between the device and the heat sink.

c. Use the tab of the device for conduction. This reduces stray inductance so that more efficient, lower voltage devices can be used.

d. Use an inexpensive mounting method which does not rely on tight assembly tolerances.

Existing power electronic systems use the following methods to mount the power devices to the heat sink, described here as "Techniques A, B and C".

Technique A uses one screw per power device, through the mounting hole in the tab of the TO-220 device into the heat sink. This approach has a number of problems:

a. accurate registration in the x, y, z and θ directions are required. Inaccurate registration causes (in the best case) reduced thermal contact between the heat sink and the device and (in the worst case) failed devices due to stress cracks.

b. drilling and tapping the heat sink is an expensive operation and inserting the screw is labor intensive c. the screw must be accurately torqued to prevent bending of the TO-220 device and reducing the area of contact between the device and the heat sink d. the mounting quality cannot be visually checked.

Technique B uses springs to press the TO-220 against the heat sink. These springs are compressed using bolts. This is an improvement over the previous system but has these disadvantages:

a. is still not cost effective (spring tooling, bolts, tapped holes and manual assembly)

b. the spring force varies with the cumulative tolerances in the mechanical system c. Further, the force on the device cannot be easily checked during production.

Technique C (for example, as disclosed in U.S. Pat. No. 5,331,258) uses springs as in technique B but compresses the spring using special production tooling until it locks into place behind a clip. The disadvantages with this system are:

a. lack of cost effectiveness (spring tooling cost, tool cost, tool wear)

b. the spring force varies with cumulative tolerances c. the spring compression operation scrapes a hard spring steel against a much softer extrusion or casting which potentially leads to metal scrapings being present during the final assembly process. These filings can move during the product lifetime and potentially cause electrical short circuits, causing the product to fail d. spring force cannot be easily checked during production e. one side of the spring is anchored in the printed circuit board. Circuit boards are not structural and the spring forces involved will cause board stresses possibly leading to stress cracks in components or traces. The mounting hole also wears with vibration and this causes the spring pressure to be unreliable. Further, the mounting hole is obtrusive.

SUMMARY OF THE INVENTION

An object of the invention is to provide a low-cost, efficient, reliable and effective means of mounting TO-220 and similar class power devices to a heat sink or bus bar.

Accordingly, in the invention a structural element is plastically deformed to compress a flat spring against a power electronic device to produce reliable and efficient thermal and mechanical contact with the heat sink or bus bar.

More specifically, the heat sink or bus bar has at least one mounting area onto which at least one power electronic device may be mounted. At least one spring is positionable against an upper surface of each power electronic device to be mounted on the heat sink or bus bar, and at least one plastically deformable element is positioned such that deformation bends a spring so as to cause the spring to exert pressure against the upper surface of at least one of the power electronic devices to bias same against the heat sink or bus bar.

The invention thus also provides a method of mounting at least one power electronic device on a heat sink or bus bar. Each power electronic device is positioned on a mounting area on the heat sink or bus bar, at least one spring is positioned against an upper surface of each device, and at least one plastically deformable element is deformed against a spring positioned so as to cause the spring to exert pressure against an upper surface of each power electronic device to bias it against the heat sink or bus bar.

BRIEF DESCRIPTION OF THE DRAWINGS

The invention will now be described in detail, with reference to the accompanying drawings of the preferred embodiment by way of example only, in which.

DETAILED DESCRIPTION OF THE PREFERRED EMBODIMENTS

Figure 2:
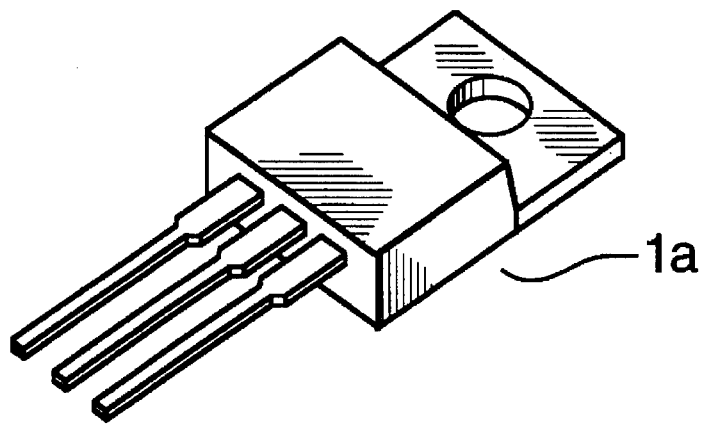
FIG. 2 (prior art) shows an industry standard TO-220 power electronic device package.
Figure 3:
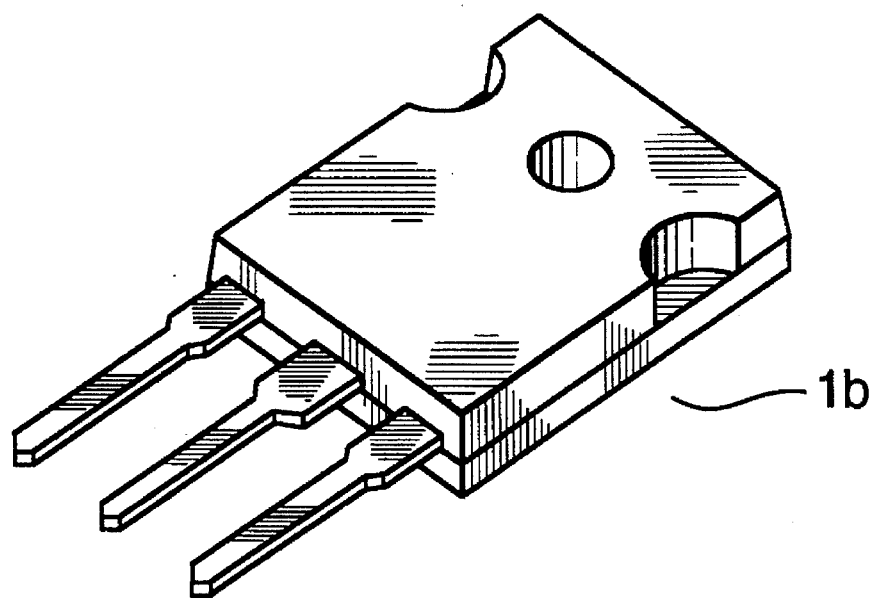
FIG. 3 (prior art) shows an industry standard TO-247 power electronic device package.

The drawings show power devices 1, a lever 2 of a plastically deformable metal such as aluminum, a spring 3 made of spring material such as spring stainless steel, a compression tool 4 to plastically deform the lever, a heat sink or bus bar 5, an optional thermally conductive electrical insulating material 6, and a printed wiring board 7. FIG. 2 shows a TO-220 device 1a, while FIG. 3 shows a TO-247 device 1b.

Figure 4:
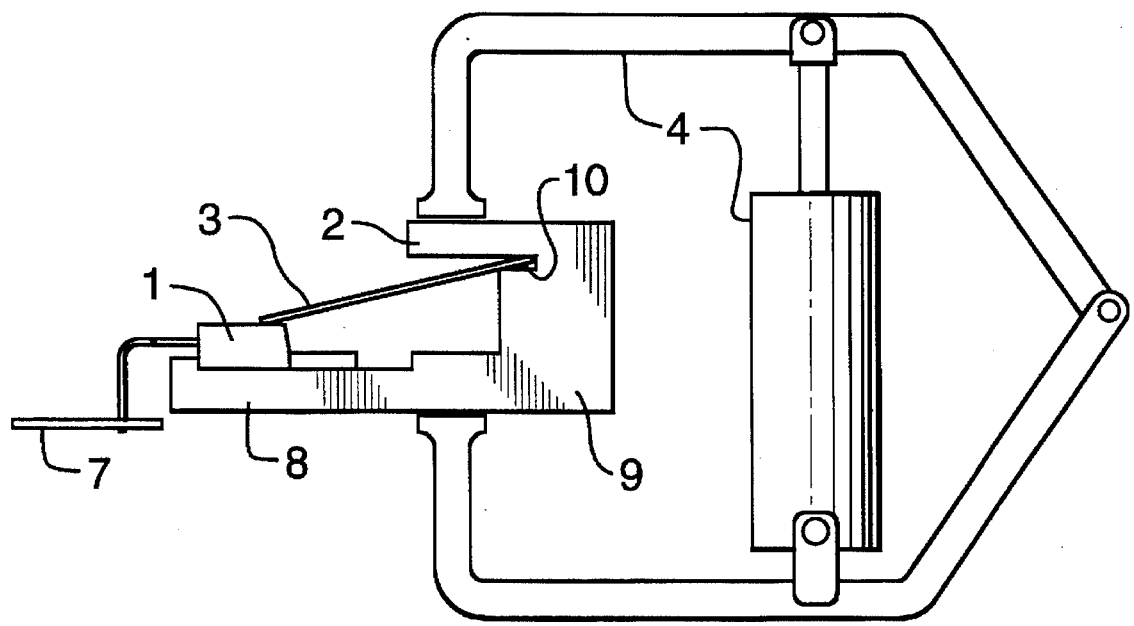
FIG. 4 is a cross-sectional view showing a TO-220 device positioned for installation on a bus bar, a spring, a perpendicular printed wiring board, and a compression tool, prior to compression of the spring.
Figure 5:
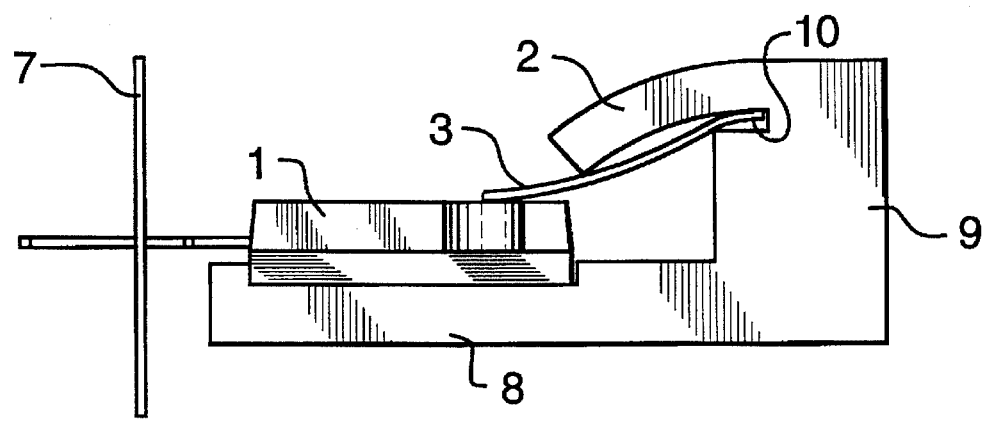
FIG. 5 is a cross-sectional view similar to FIG. 4, but showing a TO-247 device, a parallel printed wiring board, and the spring after compression.

The power device 1 is soldered to the printed wiring board in the conventional manner. Either before or after the soldering processes, the devices 1 are placed against the heat sink 5. The flat spring 3 is slid into place. If required, registration marks can be added without compromising the flat nature of the spring. The lever 2 is then compressed against the device 1 a certain distance using a compression tool, for example a hydraulic compression tool 4. FIG. 4 shows the heat sink 5 with the tool 4 prior to compression with a TO-220 type device; FIG. 5 shows this same heat sink with a TO-247 type device after the lever 2 has been plastically deformed.

Figure 1:
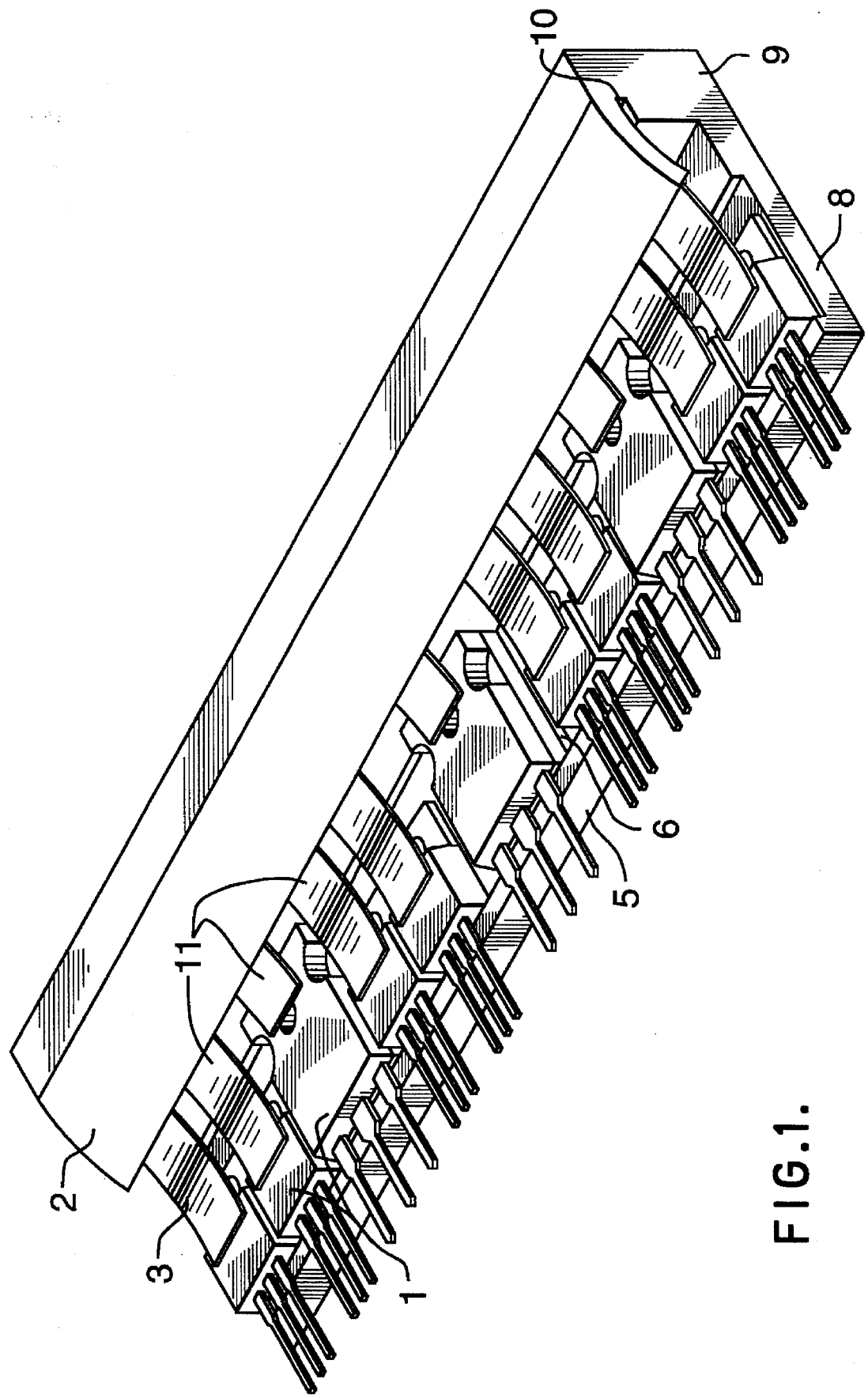
FIG. 1 is an isometric view of the power electronic device mounting apparatus in its fully assembled state with a variety of power devices in both insulated and uninsulated configurations on a single bus bar.
Figure 6:
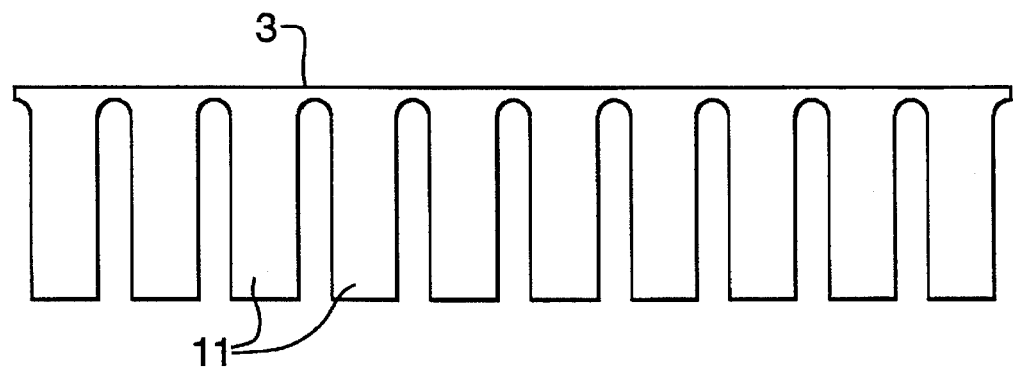
FIG. 6 is a top view of the spring for multiple TO-220's in the preferred embodiment.
Figure 7:
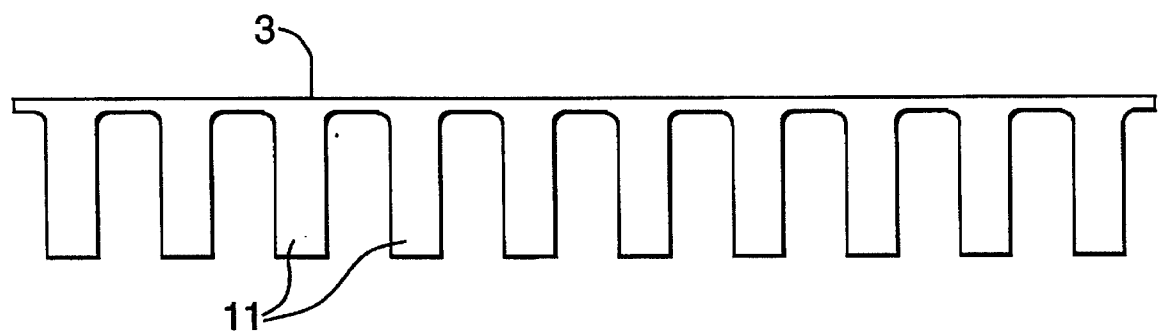
FIG. 7 is a top view of the spring for multiple TO-247's in the preferred embodiment.

Advantages of the invention are numerous, and include the following:

The materials are inexpensive and can be manufactured using any of several standard processes. The heat sink can be extruded, cast or machined according to standard methods and the invention imposes no tolerance requirements on these methods. The spring can be made from any spring material providing sufficient force for the desired deflection. The spring 3 preferably is separated into fingers 11 (FIGS. 6 and 7), with few tolerance requirements, through an inexpensive process such as stamping. FIG. 6 shows a spring for multiple TO-220's and FIG. 7 shows a spring for multiple TO-247's; FIG. 1 shows a spring which is configured for mixed components. The configuration of the fingers can be readily matched to the devices which are to be installed. Finally, no spring forming is required. The assembly process is simple, inexpensive and lends itself to automation.

The final assembly is very reliable. The force of the power device against the heat sink is easily controlled through four parameters: spring material characteristics, spring material thickness, spring finger width and lever deflection. The compressive force is more uniform and repeatable than other spring approaches.

Spring deflection is an accurate measure of force on the power device. This deflection measurement is easily performed during production and quality control procedures.

No spring forming is required. There is therefore no tooling costs, no tolerance requirements, no sourcing issues and no quality control issues. The spring is stamped directly from standard width mill roll.

There are no critical tolerances. Even drastically different devices such as the TO-220 (FIG. 2,3) and TO-247 (FIG. 2,4) can be handled using the same heat sink. Therefore, variations in heat sink, device or spring tolerances have virtually no effect on the mounting reliability.

Different power electronic devices can be handled in the same heat sink, again lowering cost.

The heat sink structure is simple and lends itself well to the inexpensive and accurate extruding process. After the extruding, there is no machining requirement for the mounting technique.

Stress on devices leads is reduced compared to other methods because accurate registration is not required.

The electronic devices 1 may be mounted perpendicular (FIG. 4) or parallel (FIG. 5) to the printed wiring board 7.

Insulated and uninsulated mounting configurations and different power device packages can be mixed on a single bus bar or heat sink by simply changing the spring shape. This is a significant advantage because it gives system designers greater flexibility in meeting other system requirements.

It should be understood that in most cases an interface material would be used between the power devices and the heat sink or bus bar to increase or decrease some combination of thermal and electrical conduction.

It is considered to be a logical extension to the invention that a single heat sink might contain more than one row of power devices. These rows might be on the same heat sink surface, an adjacent surface or the opposite surface. In this way, packaging density may be increased.

Preferably, the lever 2 is integral with the heat sink or bus bar 5, as illustrated, with both the lever and a mounting area 8 extending from a body portion 9, and one edge of the spring being positionable in a slot 10 in the body portion. However, it should be appreciated that the lever could be provided otherwise, including as a separate component suitably positioned to be brought into contact with the spring.

The invention thus provides some or all of the following advantages: It permits mounting of power devices in a low cost manner. It permits mounting of power devices in a reliable manner, regardless of device tolerances and without significant registration requirements. It provides the means to check mount quality in a simple, non-destructive manner. It involves less production tool wear than prior art arrangements. It eliminates expensive tooling for both the manufacture of the components of the invention and their assembly. It allows insulation of the power devices from the heat sink or ensures good electrical contact with a bus bar in a simple manner. It allows different devices (such as TO-200, and similar devices) to be mounted on the same heat sink or bus bar cross section. It allows the mixing of different devices in an insulated or uninsulated configuration on a single section of heat sink or bus bar in a simple manner and without compromising the previous objects.

What is claimed as the invention is:

1. A power electronic device assembly, comprising:
   a heat sink or bus bar having at least one mounting area onto which at least one power electronic device may be mounted;
   at least one spring positionable against an upper surface of each power electronic device to be mounted on said heat sink or bus bar; and
   at least one plastically deformable element positioned such that deformation of same bends said spring(s) so as to cause said spring(s) to exert pressure against said upper surface of at least one of said power electronic devices to bias same against said heat sink or bus bar.

2. An assembly as recited in claim 1, where at least one of said plastically deformable element(s) is integral with said heat sink or bus bar.

3. An assembly as recited in claim 2, where said heat sink or bus bar has at least one of said mounting areas extending from a body portion, at least one of said plastically deformable element(s) also extending from said body portion, generally towards an area above said mounting area, at least one of said spring(s) being positionable between said mounting area and said plastically deformable element(s), such that said spring(s) may be bent to exert pressure against the upper surface of an installed power electronic device by deforming said deformable element(s) towards said mounting area.

4. An assembly as recited in claim 3, where one end of each said spring is positionable in a slot provided in said body portion beneath said deformable element, to extend from said slot, beneath said deformable element(s), to an area above said mounting area.

5. A method of mounting at least one power electronic device on a heat sink or bus bar, said method comprising the steps of:
   positioning said power electronic device(s) on a mounting area on said heat sink or bus bar;
   positioning at least one spring against an upper surface of said power electronic device(s); and
   deforming at least one plastically deformable element associated with said heat sink or bus bar against said spring(s) so as to cause at least one of said spring(s) to exert pressure against an upper surface of said power electronic device(s) to bias same against said heat sink or bus bar.

* * * * *